US007661085B2

(12) United States Patent
Cho et al.

(10) Patent No.: US 7,661,085 B2
(45) Date of Patent: Feb. 9, 2010

(54) METHOD AND SYSTEM FOR PERFORMING GLOBAL ROUTING ON AN INTEGRATED CIRCUIT DESIGN

(75) Inventors: Minsik Cho, Austin, TX (US); Zhigang Pan, Austin, TX (US)

(73) Assignee: Board of Regents, The University of Texas System, Austin, TX (US)

( * ) Notice: Subject to any disclaimer, the term of this patent is extended or adjusted under 35 U.S.C. 154(b) by 113 days.

(21) Appl. No.: 11/781,692

(22) Filed: Jul. 23, 2007

(65) Prior Publication Data

US 2009/0031275 A1    Jan. 29, 2009

(51) Int. Cl.
*G06F 17/50* (2006.01)
(52) U.S. Cl. ............................... 716/12; 716/13; 716/14
(58) Field of Classification Search ........................ None
See application file for complete search history.

(56) References Cited

U.S. PATENT DOCUMENTS

| | | | | |
|---|---|---|---|---|
| 4,831,725 | A | * | 5/1989 | Dunham et al. ............... 29/847 |
| 5,587,923 | A | * | 12/1996 | Wang ............................ 716/13 |
| 5,784,289 | A | * | 7/1998 | Wang ............................. 716/8 |
| 5,847,965 | A | * | 12/1998 | Cheng ............................ 716/9 |
| 6,260,183 | B1 | * | 7/2001 | Raspopovic et al. .......... 716/12 |

OTHER PUBLICATIONS

Albrecht, "Global Routing by New Approximation Algorithms for Multicommodity Flow," IEEE Trans. on CAD of ICs and Systems, vol. 20, No. 5, May 2001, pp. 622-632.*
Burstein et al., "Hierarchical Wire Routing," IEEE Trans. on CAD, vol. CAD-2, No. 4, Oct. 1983, pp. 223-234.*
Chu, "FLUTE: Fast Lookup Table Based Wirelength Estimation Technique," 2004 IEEE, pp. 696-701.*
Hadsell et al., "Improved Global Routing through Congestion Estimation," 2003 DAC, pp. 28-31.*
Hu et al., "A Timing-constrained Algorithm for Simultaneous Global Routing of Multiple Nets," 2000 IEEE/ACM ICCAD, pp. 99-103.*
Hu et al., "A Survey on Multi-net Global Routing for Integrated Circuits," Integration, VLSI Journal, vol. 31, No. 1, 68 pages, 2001.*
Kahng et al., "Accurate Pseudo-Constructive Wirelength and Congestion Estimation," SLIP 2003, 8 pages.*
Lou et al., "Estimation Routing Congestion Using Probabilistic Analysis," IEEE Trans. On CAD of ICs and Systems, vol. 21, No. 1, Jan. 2002, pp. 32-41.*
Wang et al., "Modeling and Minimization of Routing Congestion," 2000 IEEE, pp. 185-190.*
Wang et al., "On the Behavior of Congestion Minimization During Placement," ACM 1999 Int'l Symposium on Physical Design, pp. 145-150.*
Westra et al., "Global Routing: Metrics, Banchmarks, and Tools," IEEE DATC Electronic Design Process, Apr. 2005, 6 pages.*

* cited by examiner

*Primary Examiner*—Leigh Marie Garbowski
(74) *Attorney, Agent, or Firm*—Antony P. Ng; Dillon & Yudell LLP

(57) ABSTRACT

A method for performing global routing on an integrated circuit design is disclosed. The integrated circuit design is initially divided into multiple G-cells. The G-cells are interconnected by a set of nets. The set of nets is then decomposed into corresponding wires. The wires are prerouted to interconnect the G-cells. BoxRouting is performed on the wires until all the wires are routed. Finally, postrouting is performed on the wires.

10 Claims, 8 Drawing Sheets net a-b-c-d

METHOD AND SYSTEM FOR PERFORMING GLOBAL ROUTING ON AN INTEGRATED CIRCUIT DESIGN

BACKGROUND OF THE INVENTION

1. Technical Field

The present invention relates to circuit routing in general, and, in particular, to a method and system for performing global routing on an integrated circuit design.

2. Description of Related Art

Routing is a key stage within a very-large scale integrated circuit (VLSI) design process. Since routing directly affects interconnect properties (such as wire length, routability, etc.), routing plays a critical role in the overall performance of a VLSI design. With nanometer interconnects, the manufacturability and variability issues, such as antenna effect, copper chemical-mechanical polishing (CMP), subwavelength printability, and yield loss due to random defects, are becoming a growing concern for VLSI designers. Hence, routing also plays a major role in terms of manufacturing closure.

Global routing, as its name implies, is the stage of routing that plans the approximate routing path of each net within a VLSI design in order to reduce the complexity of routing task that is eventually performed by a detailed router. Thus, global routing has significant impacts on wire length, routability and timing. Optimizing the wire density distribution during global routing can improve overall manufacturability such as less post-CMP topography variation, less copper erosion/dishing, and less optical interference for better printability. In addition, with faster global routing, more accurate interconnect information (such as wirelength and congestion) can be fed back to placement or other early physical synthesis engines for achieving better design convergence.

Consequently, it would be desirable to provide an improved method and system for performing global routing on a VLSI design.

SUMMARY OF THE INVENTION

In accordance with a preferred embodiment of the present invention, an integrated circuit design is divided into multiple G-cells. The G-cells are interconnected by a set of nets. The set of nets is then decomposed into corresponding wires. The wires are prerouted to interconnect the G-cells. BoxRouting is performed on the wires until all the wires are routed. Finally, postrouting is performed on the wires.

All features and advantages of the present invention will become apparent in the following detailed written description.

BRIEF DESCRIPTION OF THE DRAWINGS

The invention itself, as well as a preferred mode of use, further objects, and advantages thereof, will best be understood by reference to the following detailed description of an illustrative embodiment when read in conjunction with the accompanying drawings, wherein.

DETAILED DESCRIPTION OF A PREFERRED EMBODIMENT

The notations utilized in the present disclosure are defined as follows:

$v_i$=vertex/global routing cell i $e_{ij}$=edge between $v_i$ and $v_j$ $m_{ij}$=maximum routing resource of $e_{ij}$ $c_{ij}$=available routing resource of $e_{ij}$ For a very-large scale integrated circuit (VLSI) design, the global routing problem can be modelled as a grid graph G(V, E), also known as a global routing cell (G-cell), where each vertex $v_i$ represents a rectangular region of the VLSI design, and an edge $e_{ij}$ represents the boundary between $v_i$ and $v_j$ with a given maximum routing resource $m_{ij}$.

Figure 1A:
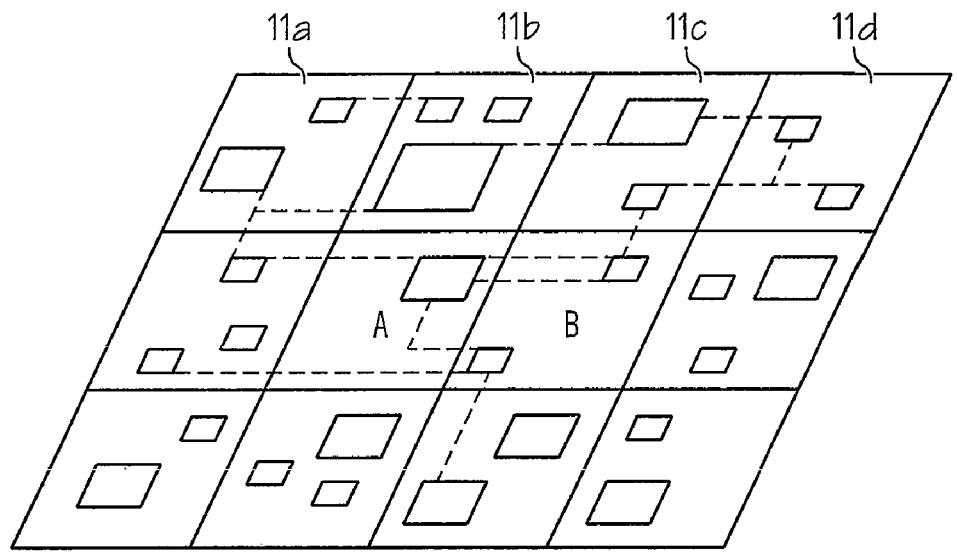
FIGS. 1a-1b show a method of abstracting grid graphs from an integrated circuit design.
Figure 1B:
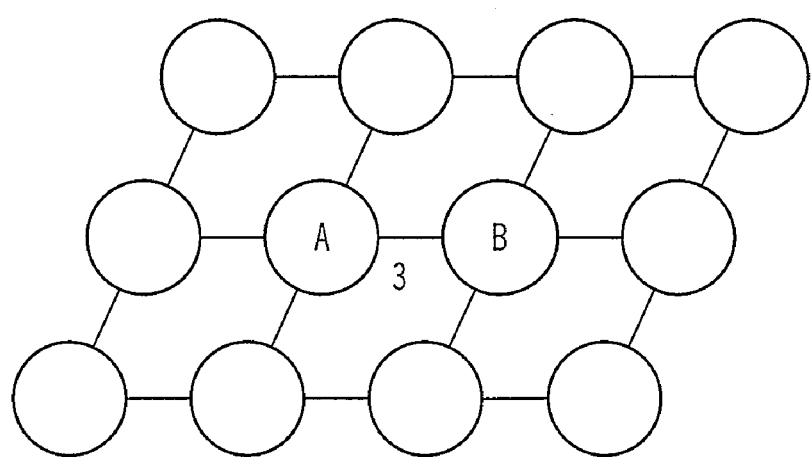

With reference now to the drawings and in particular to FIGS. 1a-1b, there are depicted a method of abstracting grid graphs from a VLSI design. FIG. 1a shows a VLSI design having multiple G-cells such as G-cells 11a-11d. The objective of global routing is to find the paths that connect the pins inside the G-cells through G(V,E) for every net. The key task of a global router is to maximize the routability for successful detailed routing. Routability can be estimated by the number of overflows that serves to indicate that routing demand locally exceeds the available routing capacity. In FIG. 1b, the number of overflows between $v_A$ and $v_B$ is one because there are four routed nets and $m_{AB}$=3.

Other than routing, wire length is also an important metric for placement. But wire length is less of a concern for global routing because routing all wires with a shortest path algorithm will result in minimum or near-minimum wire length. However, there can be a huge difference between solutions of the same wire length in terms of routability. Runtime is fairly significant in global routing because global routing links placement and detailed routing, and parasitic information needs to be fed to higher level of design flow for design convergence.

In accordance with a preferred embodiment of the present invention, a new global routing technique known as "BoxRouting" is utilized to perform global routing. Based on congestion-initiated box expansion, BoxRouting progressively expands a box that initially covers the most congested region only, but finally covers an entire VLSI design. After each box expansion, a circuit is divided into two sections, namely, inside the box and outside the box. BoxRouting then uses different routing strategies for each of the two sections in order to maximize routability and minimize wire length.

Figure 2A:
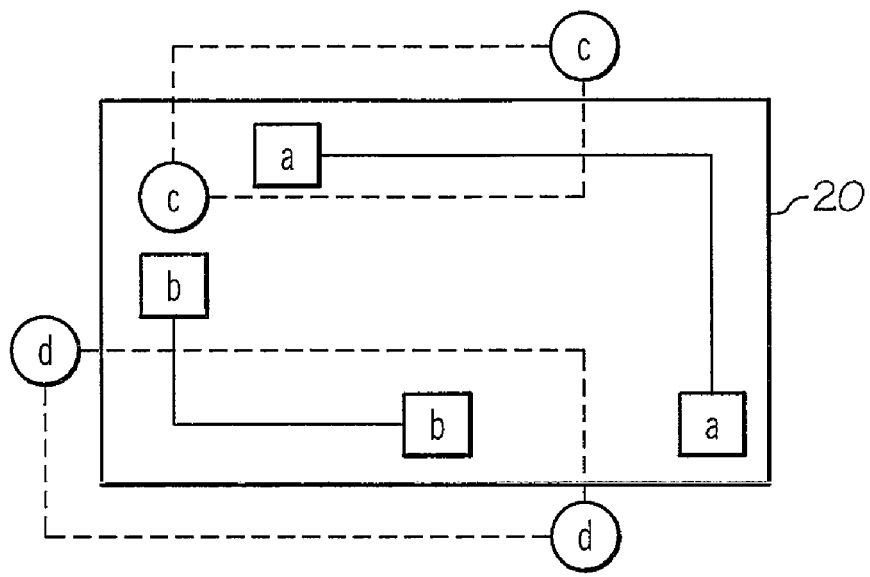
FIGS. 2a-2b show the basic concepts of BoxRouting.
Figure 2B:
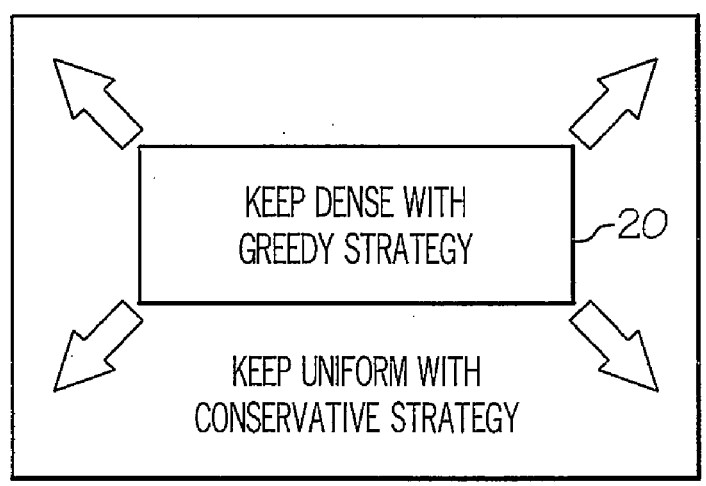

With reference now to FIGS. 2a and 2b, there are depicted the basic concepts of BoxRouting, in accordance with a preferred embodiment of the present invention. In FIG. 2a, wires a and b are located inside a box 20, and wires c and d are located outside box 20. The routing resource inside box 20 is more precious to wires a and b than to wires c and d for the following two reasons:

i. if wire a or b is not routed within box 20, wire length will be increased due to detour; and ii. wires c and d may have another viable routing path outside box 20 that does not require the routing resource inside box 20.

Therefore, BoxRouting first routes as many wires inside box 20 as possible by utilizing progressive integer linear programming (ILP) routing by maximally utilizing the routing resource inside box 20. Then, for the wires within box 20 that cannot be routed by progressive ILP (due to insufficient routing resources), BoxRouting detours them by adaptive maze routing with the following two strategies:

i. inside box 20: use the routing resources generously (as much as possible), as the wires inside box 20 have priority over the wires outside box 20; and ii. outside box 20: use the routing resources conservatively, as the wires outside box 20 may need them later for their routing paths.

Those two strategies, as shown in FIG. 2b, make the wire density of an integrated circuit design and help the wires detour in the more congested region in order to maximize the routability with minimum detour.

Figure 3:
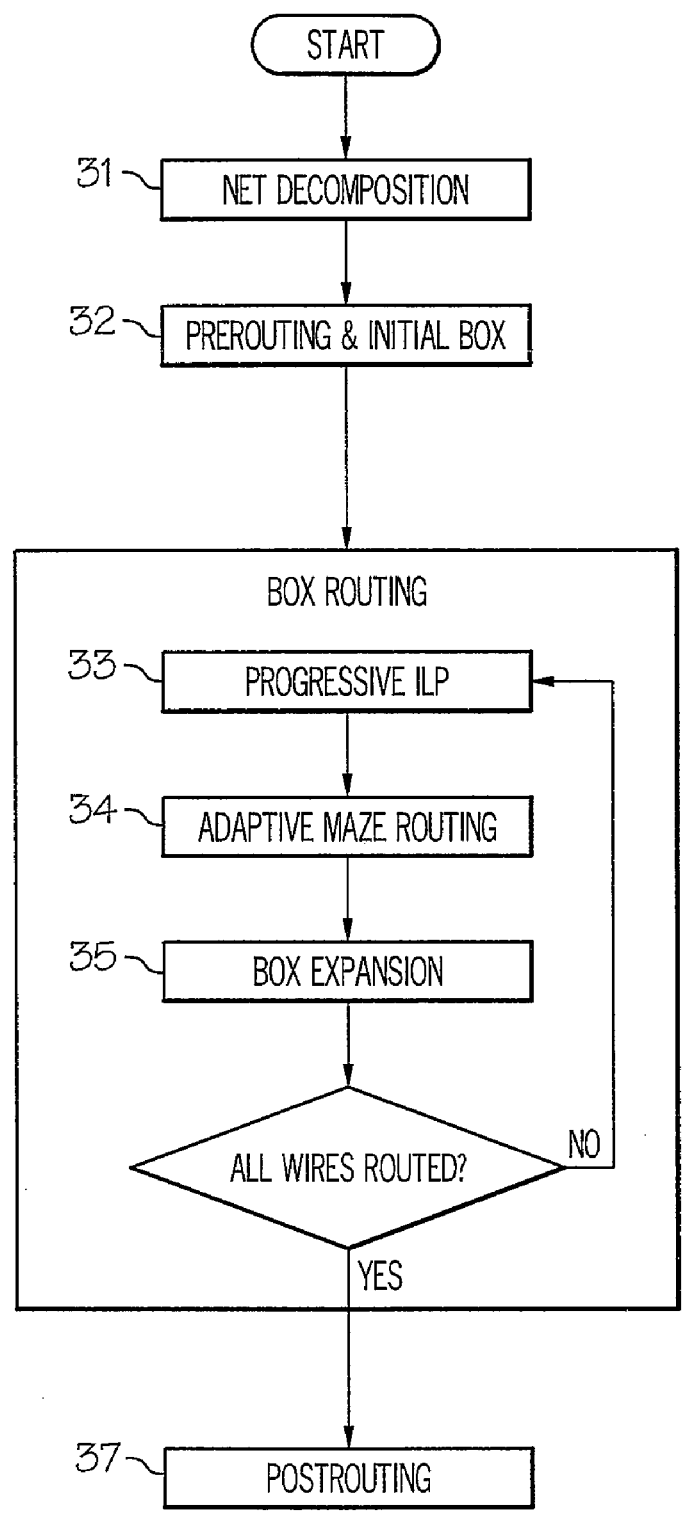
FIG. 3 is a high-level logic flow diagram of a method for performing global routing using BoxRouting, in accordance with a preferred embodiment of the present invention.

Referring now to FIG. 3, there is illustrated a high-level logic flow diagram of a method for performing global routing via BoxRouting, in accordance with a preferred embodiment of the present invention. Initially, preprocessing for BoxRouting is performed. Preprocessing for BoxRouting includes the performance of Net Decomposition, as shown in block 31, and the performance of Pre-routing and Initial Box, as depicted in block 32.

Figure 4A:
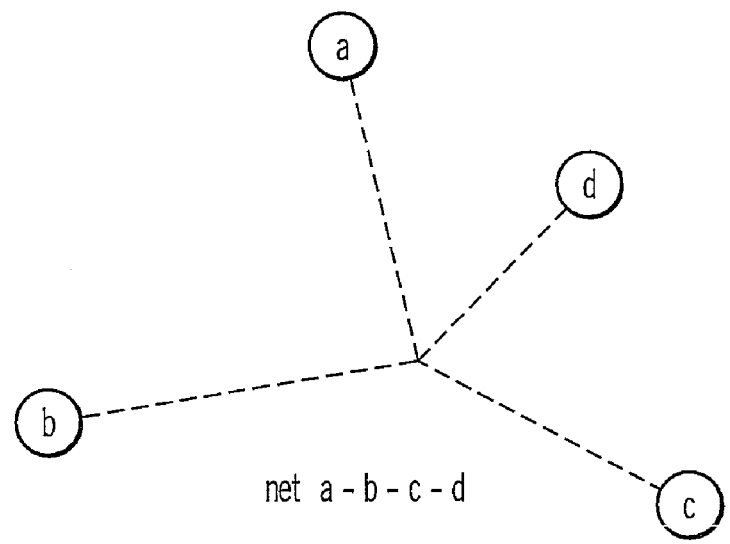
FIGS. 4a-4b show a net decomposed into two-pin wires with Rectilinear Minimum Seiner Tree.
Figure 4B:
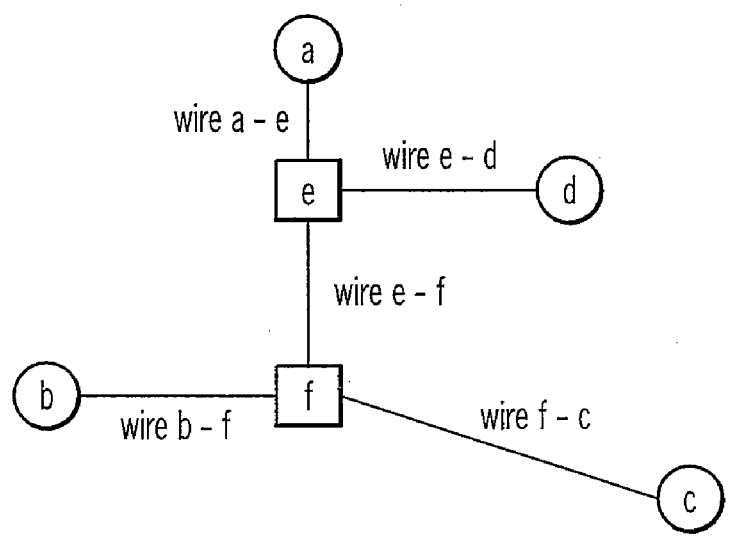

Net Decomposition can be preformed by utilizing any fast and accurate Steiner Tree algorithm that is well-known in the art. During Net Decomposition, a net can be decomposed into two pin wires with Rectilinear Minimum Seiner Tree, as shown in FIGS. 4a-4b. A special wire that does not need a bend is called a flat wire. For example, in FIG. 4b, wire a-e, wire e-d, wire e-f and wire b-f are flat wires.

The purpose of Pre-routing is for congestion estimation and for speeding up the routing process. Pre-routing simply routes as many flat wires as possible via the shortest path without creating any overflow. As the bulk of a net can be routed in simple patterns (L-shape or Z-shape), Pre-routing can improve runtime without degrading the final solution. Importantly, if there are enough wires that can be routed by Pre-routing, the global congestion view can be obtained. On an average, approximately 60% of the final wire length can be routed by Pre-routing with a very small computational overhead.

Next, BoxRouting is performed on the net. BoxRouting preferably includes three steps, namely, progressive ILP routing, as shown in block 33, adaptive maze routing, as depicted in block 34, and box expansion, as shown in block 35. The steps in blocks 33-35 are to be repeated until an expanded box covers an entire circuit.

Figure 5A:
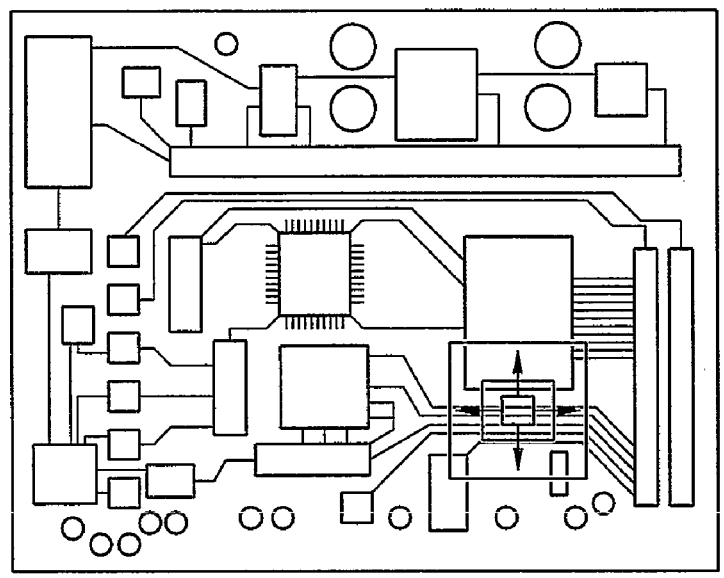
FIGS. 5a-5f graphically depicts an example of global routing using BoxRouting, in accordance with a preferred embodiment of the present invention.
Figure 5B:
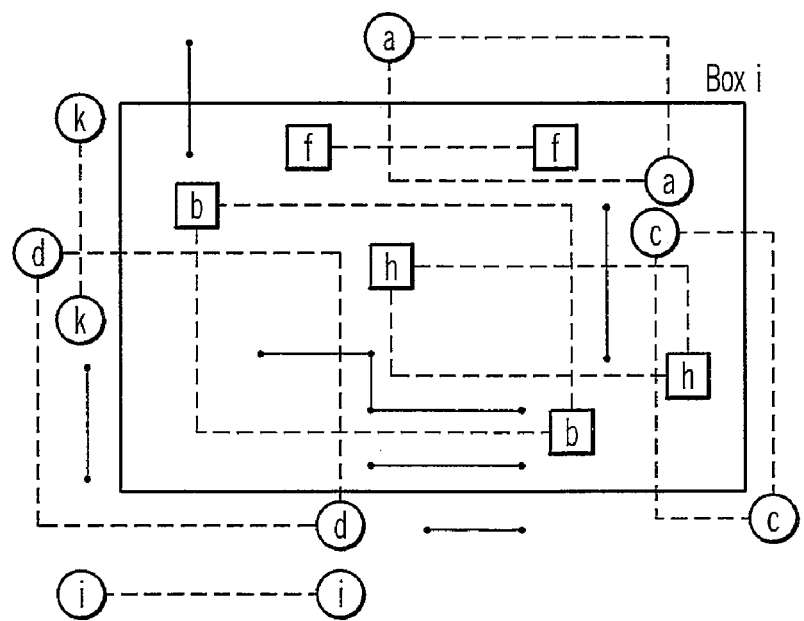

Assuming a box is expanded from the most congested region within a VLSI design, as shown in FIG. 5a, then after an $i^{th}$ expansion (i.e., box i), wires within the box are represented by squares b, f and h, and other wires are represented by circles, as shown in FIG. 5b. The already routed wires, either by PreRouting or by previous BoxRouting, are depicted as solid lines in FIG. 5b. Some flat wires in FIG. 5b, such as wires f, i and k, remain to be not routed until BoxRouting when PreRouting gives up routing a wire due to any overflow or new Steiner points introduced by adaptive maze routine convert a non-flat wire into a flat wire.

Figure 5C:
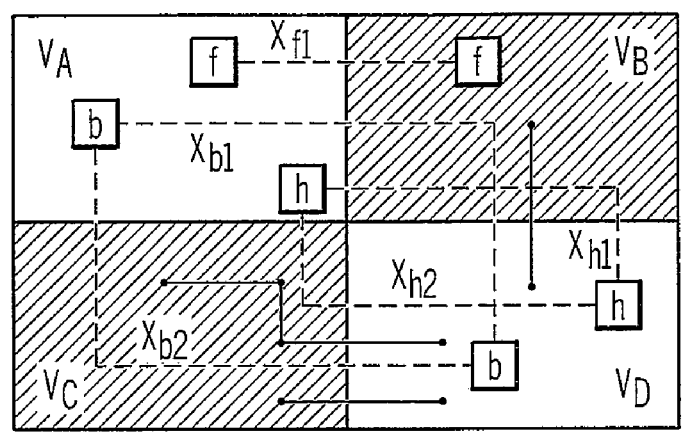

As mentioned previously, only wires within the box are routed by progressive ILP and adaptive maze routing for efficient routing. In FIG. 5c, the wires within the box are shown with G-cells (i.e., $v_A$, $v_B$, $v_C$ and $v_D$), and the corresponding progressive ILP formulation for maximum routability is shown as follows:

$$\max: x_{b1}+x_{b2}+x_{f1}+x_{f2}+x_{h1}+x_{h2}$$

$$\text{s.t:} \; x_{b1},x_{b2},x_{f1},x_{f2},x_{h1},x_{h2} \in \{0,1\}$$

$$x_{b1}+x_{b2} \leq 1$$

$$x_{f1} \leq 1, x_{f2} 0$$

$$x_{h1}+x_{h2} \leq 1$$

$$x_{b1}+x_{f1}+x_{h1} \leq c_{AB}$$

$$x_{b1}+x_{h1} \leq c_{BD}$$

$$x_{b2}+x_{h2} \leq c_{AC}$$

$$x_{b2}+x_{h2} \leq c_{CD}$$

To minimize the number of vias, two L-shape routings ($x_{b1}$, $x_{b2}$ and $x_{h1}$, $x_{h2}$) are considered for each wire in the ILP formulation, but only one routing ($x_{f1}$ and $x_{f2}=0$) is considered for flat wires. General progressive ILP formulation is shown as follows:

$$\begin{aligned}
\max: \quad & \Sigma\{x_{i1}+x_{i2}\} & \forall i \in W_{box} \\
\text{s.t:} \quad & x_{i1},x_{i2} \in \{0,1\} & \forall i \in W_{box} \\
& x_{i1}+x_{i2} \leq 1 & \forall i \in W_{box} \\
& x_{i2} = 0 & \forall i \in W_{box} \cap W_{flat} \\
& \Sigma_{e \in xi,j} x_{ij} \leq c_e & \forall e \in W_{box}
\end{aligned}$$

where $W_{box}$ is a set of unrouted wires within the current box, and $W_{flat}$ is a set of flat wires.

Figure 5D:
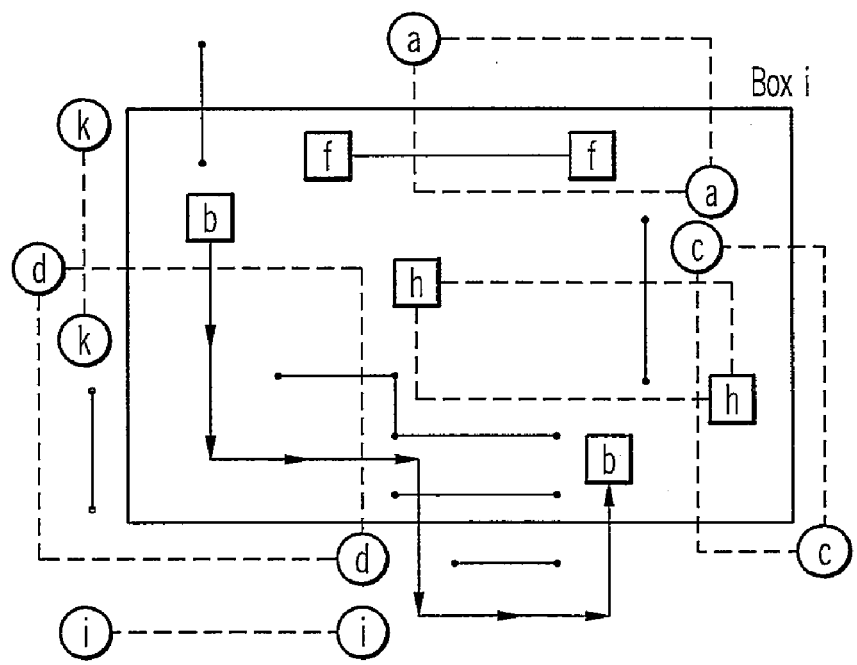
Figure 5E:
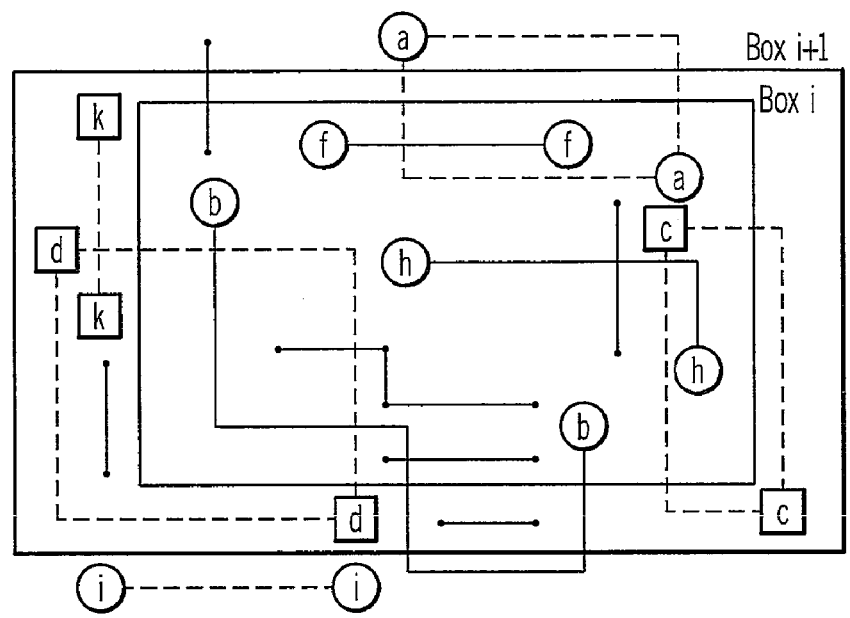

The present ILP approach progressively routes a part of the circuit, which is covered by each expanding box. Also, as the solution from Box i is reflected in the next routing problem of Box i+1 (Box i+1 always encompasses Box i), the progressive ILP approach provides a seamless and incremental routing. Even though the last box can cover the entire circuit, the ILP size remains tractable because ILP is performed on the wires between two boxes like between Box i and Box i+1, as shown in FIG. 5e.

However, due to the limited routing resource of each edge, some wires may not be routed with progressive ILP. For example, assuming $m_{CD}=2$, wire b cannot be routed with the ILP ($x_{b1}=x_{b2}=0$) because two pre-routed wires on $e_{CD}$ consume all the routing resources. In this case, wire b is routed by adaptive maze routing, as shown in FIG. 5d, with the cost from an Algorithm 1 listed in Table I.

TABLE I

| | |
|---|---|
| Input: | G-Cell X, Y, Box B |
| 1: | Cost C = $m_{XY}$ − $C_{XY}$ |
| 2: | if $e_{XY}$ is inside B and $c_{XY}$ > 0 then |
| 3: | C = 1 |
| 4: | end if |
| Output: | C |

Algorithm 1 returns a unit cost as long as $e_{XY}$ is inside a box and still has available routing resource (lines 2, 3). Otherwise, it returns a cost inversely proportional to the available routing resources (line 1). This cost function makes adaptive maze routing find the shortest path inside the box for wirelength minimization, but the most idle path outside the box for routability maximization. The resource outside the box should be used conservatively because the wires outside the current box may need them later. If too big of a detour is required in order to avoid small overflows, adaptive maze routing that looks for the minimum cost path may return a routing path with overflows.

Figure 5F:
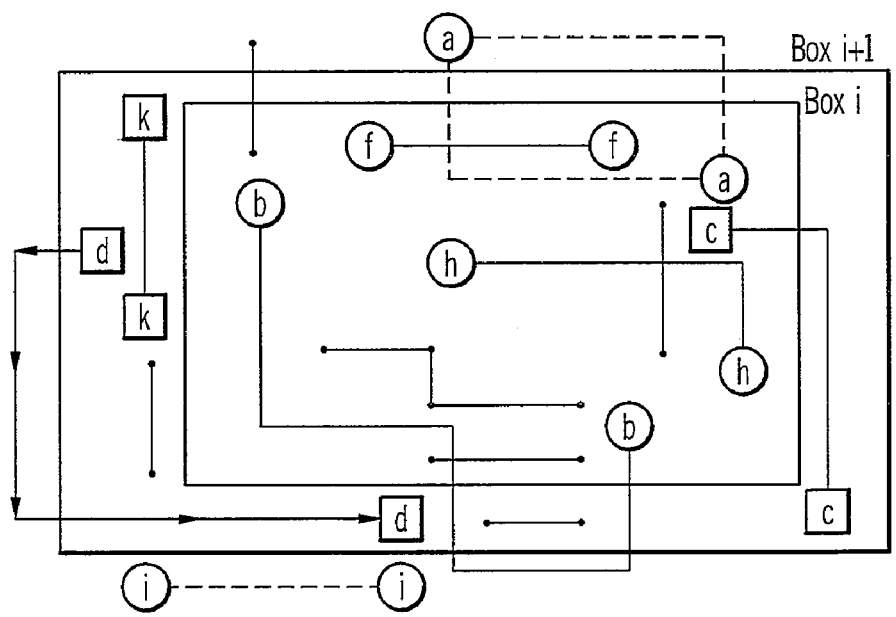

After all the wires inside the box are routed either by progressive ILP or adaptive maze routing, Box i will be expanded to Box i+1, and new wires c, d and k are encompassed by Box i+1, as shown in FIG. 5e. The result after applying BoxRouting (progressive ILP and adaptive maze routing) again, as shown in FIG. 5f. The amount of increment during box expansion significantly affects the routing solution. As the box grows larger for every expansion with bigger increment, the runtime increases exponentially due to larger ILP problem size (more wires are added into the formulation due to larger expansion). However, the smaller overflow can be obtained because the routing is performed more globally.

By each iteration of BoxRouting, all the wires in the more congested region (within the box) are routed first by progressive ILP, then by adaptive maze routing. This makes the wires outside the box detour the box because there is a lower chance of being routed through the box. Such wire detouring works like diffusing wires to the low congested area, which can improve routability at the expense of wire length.

After all wires have been routed (the box becomes large enough to cover the entire circuit), PostRouting (re-route without rip-up) is subsequently preformed, as shown in block 37 of FIG. 3.

PostRouting reroutes wires to remove unnecessary overhead with box expansion initiated from the most congested region, as done in BoxRouting. Specifically, a wire in the more congested region is rerouted first, and such rerouted wire can release the routing resource, as it may find the better routing path. Then, the surrounding wires can be rerouted with the released routing resource, potentially reducing detour and overflow again. Such a chain reaction propagates from the most congested region to less congested regions along the box expansion.

Maze routing is used for PostRouting, but with a different routing cost function via an Algorithm 2 as listed in Table II, where parameter K is introduced. The parameter K controls the tradeoffs between wirelength and routability (overflow) by setting the cost of each overflow as K. Thus, a higher K discourages overflow at a cost of wirelength increase (more detours), but a lower K suppresses detour at a cost of overflows.

TABLE II

| Input: | G-Cell X, Y, Parameter K |
|---|---|
| 1: | Cost C = K |
| 2: | if $e_{XY} > 0$ then |
| 3: | C = 1 |
| 4: | end if |
| Output: | C |

After global routing has been completed, layer assignment can be utilized to distribute wires across various layers. Layer assignment generally affects several design objectives, such as timing, noise, and manufacturability, but the present embodiment of layer assignment mainly focuses on via minimization without altering routing topology. The present via-aware layer assignment inherently differs from the prior art layer assignment, such as constrained via minimization (CVM), in two aspects. First, multiple wires can be overlapped where there are enough routing capacities between G-cells (CVM does not allow wire overlapping due to DRC). Second, wires can be split into multiple pieces to avoid blockages (CVM cannot).

An ILP for via-aware layer assignment is shown as follows:

max: $\Sigma_i \Sigma_{s \in P(i)} (T_{is} - B_{is})$
s.t:
(a) $z_{ijk} \in \{0,1\}$     $\forall i,j,k$
(b) $\Sigma_k z_{ijk} = 1$     $\forall i,j,k$
(c) $\Sigma_k k \cdot z_{ijk} = 1_{ij}$     $\forall i,j,k$
(d) $B_{is} \leq 1_{ij} \leq T_{is}$     $\forall (i,j) \in W(i,s)$
(e) $B_s = M1$     $\forall s \in N(i)$
(f) $\Sigma_{(i,j,k) \in C(e)} z_{ijk} \leq r_e$     $\forall e$ where
W(i,s)=a set of wires of a net i passing a point s (including pins)
P(i)=a set of points in a net i
N(i)=a set of pins in a net i (N(i)⊆P(i))
C(e)=a set of wires crossing an edge e
$r_e$=available routing capacity of an edge e
$z_{ijk}$=a binary variable set to 1 if a wire j of a net i is assigned k layer
$1_{ij}$=layer assigned to a wire j of a net i
$T_{is}$=top layer assigned to any wire on a point s ∈ P(i)
$B_{is}$=bottom layer assigned to any wire on a point s ∈ P(i)

The objective of via-aware layer assignment is to minimize the difference between a top layer and a bottom layer used by wires of each net for each point. The constraint (b) is to assign a wire j of a net i to one of the layers. $1_{ij}$ of the constraint (c) is computed by the combination of $z_{ijk}$. Then, $T_{is}$ and $B_{is}$ are captured by the constraint (d). If there is a pin on s, the $B_{is}$ is set as M1 in the constraint (e). Finally, all the layer assignment cannot violate the capacities of all the edges by the constraint (f). Although the ILP formulation can optimally minimize the number of vias during layer assignment, it has two drawbacks:

i. depending on blockage locations, the formulation can be infeasible, and
ii. ILP inherently cannot be applied for large designs.

Since the exact layer information on blockages is diluted in a two-dimensional (2D) global routing, the layer assignment based on the 2D routing result may not be feasible. The infeasible issue can be addressed by chopping wires, wherever a blockage exits, but this may result in not only unnecessary vias but also too many variables in ILP. Therefore, it is better to break a wire only if needed.

ILP is computationally expensive, as most solvers use branch-and-bound algorithm. Thus, in order to apply ILP to industrial designs, the problem size should be tractable, while maintaining the global view. Box expansion and progressive ILP formulation can be applied to layer assignment. The core idea of progressive ILP is to start with a minimal box covering the most congested region. Then, the problem inside the box (i.e., layer assignment) is solved by ILP. But, since the current problem encloses the previous problem (which has been solved), the actual problem is limited down to routing only the wires between two consecutive boxes, which in turn makes problem size tractable.

Figure 6:
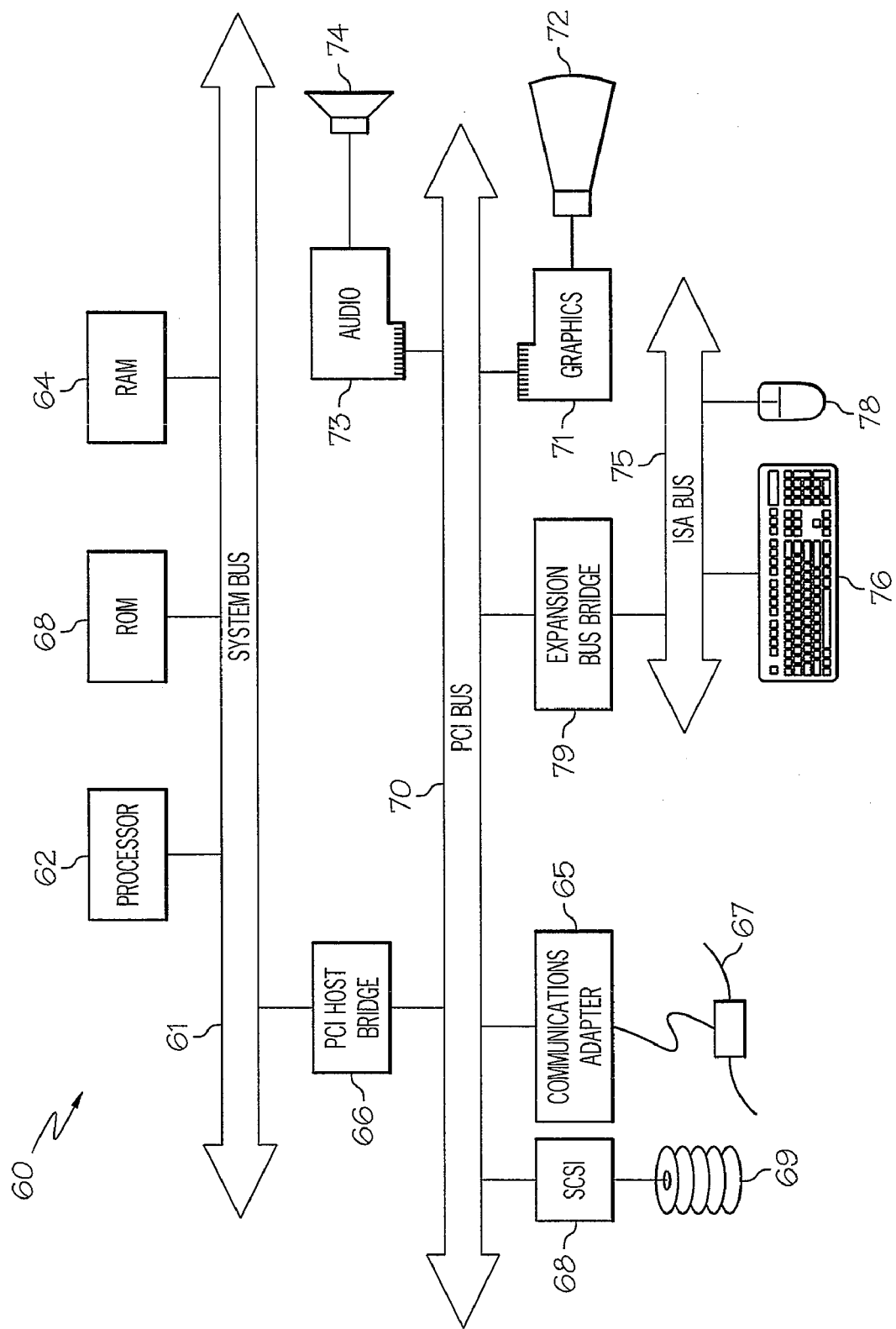
FIG. 6 is a block diagram of a computer system in which a preferred embodiment of the present invention is incorporated.

With reference now to FIG. 6, there is depicted a block diagram of a computer system 60 in which a preferred embodiment of the present invention is incorporated. As shown, a processor 62, a read-only memory (ROM) 63, and a random access memory (RAM) 64 are connected to a system bus 61. Processor 62, ROM 63, and RAM 64 are also coupled to a peripheral component interconnect (PCI) bus 70 of computer system 60 through a PCI host bridge 66.

In addition, an audio adapter 73 and a graphics adapter 71 may be attached to PCI bus 70. Graphics adapter 71 controls visual output through a video monitor 72 and audio adapter 70 controls audio output through a speaker 74. Also attached to PCI bus 70 is a communications adapter 65 and a small computer system interface (SCSI) 68. Communications adapter 65 connects computer system 60 to a local-area network (LAN) 67. SCSI 68 is utilized to control a high-speed SCSI disk drive 69. Expansion bus bridge 79, such as a PCI-to-ISA bus bridge, may be utilized for coupling an industry standard architecture (ISA) bus 75 to PCI bus 70. As shown, a keyboard 76 and a mouse 78 are attached to ISA bus 75 for performing certain basic I/O functions.

As has been described, the present invention provides a method and system for performing global routing of a VLSI design.

It is also important to note that although the present invention has been described in the context of a fully functional computer system, those skilled in the art will appreciate that the mechanisms of the present invention are capable of being distributed as a program product in a variety of forms, and that the present invention applies equally regardless of the particular type of signal bearing media utilized to actually carry out the distribution. Examples of signal bearing media include, without limitation, recordable type media such as compact disks.

While the invention has been particularly shown and described with reference to a preferred embodiment, it will be understood by those skilled in the art that various changes in form and detail may be made therein without departing from the spirit and scope of the invention.

What is claimed is:

1. A method for performing global routing on an integrated circuit design, said method comprising:
    dividing said integrated circuit design into a plurality of G-cells using a computer system, wherein said plurality of G-cells are interconnected by a plurality of nets;
    decomposing said plurality of nets into a plurality of corresponding wires;
    prerouting some of said wires to connect said plurality of G-cells;
    initiating a box around a region of said integrated circuit design in which wires are most congested;
    performing a BoxRouting routine starting with wires within said box until all wires within said integrated circuit design are routed, wherein said BoxRouting routine includes
        performing progressive integer linear programming (ILP) routing to route as many unrouted wires within said box as possible without incurring routing congestion;
        performing adaptive maze routing to route any remaining unrouted wire within said box after said ILP routing performance; and
        performing box expansion to expand said box on every direction such that a new box covers all of said box; and
    performing postrouting on wires within said integrated circuit design.

2. The method of claim 1, wherein said progressive ILP routing only routes wires inside said box and does not route any wire outside said box.

3. The method of claim 1, wherein said progressive ILP routing utilizes G-cells inside said box and does not utilize G-cells outside said box.

4. The method of claim 1, wherein said adaptive maze routing utilizes G-cells inside and outside said box.

5. The method of claim 1, wherein said adaptive maze routing utilizes routing resources more aggressively when searching for a routing path inside said box than searching for a routing path outside said box.

6. A computer usable medium having a computer program product for performing global routing on an integrated circuit design, said computer usable medium comprising:
    program product code for dividing said integrated circuit design into a plurality of G-cells, wherein said plurality of G-cells are interconnected by a plurality of nets;
    program product code for decomposing said plurality of nets into a plurality of corresponding wires;
    program product code for prerouting some of said wires to connect said plurality of G-cells;
    program product code for initiating a box around a region of said integrated circuit design in which wires are most congested;
    program product code for performing a BoxRouting routine starting with wires within said box until all wires within said integrated circuit design are routed, wherein said BoxRouting routine includes
        performing progressive integer linear programming (ILP) routing to route as many unrouted wires within said box as possible without incurring routing congestion;
        performing adaptive maze routing to route any remaining unrouted wire within said box after said ILP routing performance; and
        performing box expansion to expand said box on every direction such that a new box covers all of said box; and
    program product code for performing postrouting on wires within said integrated circuit design.

7. The computer usable medium of claim 6, wherein said program product code for performing progressive ILP routing only routes wires inside said box and does not route any wire outside said box.

8. The computer usable medium of claim 6, wherein said program product code for progressive ILP routing utilizes G-cells inside said box and does not utilize G-cells outside said box.

9. The computer usable medium of claim 6, wherein said program product code for performing adaptive maze routing utilizes G-cells inside and outside said box.

10. The computer usable medium of claim 6, wherein said program product code for performing adaptive maze routing utilizes routing resources more aggressively when searching for a routing path inside said box than searching for a routing path outside said box.

* * * * *